(12) United States Patent
Onodera

(10) Patent No.: US 7,476,835 B2
(45) Date of Patent: Jan. 13, 2009

(54) DRIVING METHOD FOR SOLID-STATE IMAGING DEVICE AND IMAGING APPARATUS

(75) Inventor: Tatsuo Onodera, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 11/874,357

(22) Filed: Oct. 18, 2007

(65) Prior Publication Data

US 2008/0093533 A1    Apr. 24, 2008

(30) Foreign Application Priority Data

Oct. 19, 2006    (JP)    ............................ P2006-285193

(51) Int. Cl.
*H04N 3/14* (2006.01)
*H04N 5/335* (2006.01)

(52) U.S. Cl. ...................... 250/208.1; 348/282; 348/311

(58) Field of Classification Search .............. 250/208.1; 348/282, 311

See application file for complete search history.

(56) References Cited

U.S. PATENT DOCUMENTS

| 6,400,404 | B2 * | 6/2002 | Hirota et al. ................. 348/314 |
| 6,952,228 | B2 * | 10/2005 | Yoneda et al. ............... 348/308 |
| 2001/0043275 | A1 * | 11/2001 | Hirota et al. ................. 348/312 |
| 2002/0067416 | A1 * | 6/2002 | Yoneda et al. ............... 348/304 |
| 2005/0052552 | A1 * | 3/2005 | Hashimoto .................. 348/272 |
| 2005/0231619 | A1 * | 10/2005 | Nakamura et al. .......... 348/303 |
| 2006/0022117 | A1 * | 2/2006 | Yamada .................... 250/208.1 |
| 2006/0092304 | A1 * | 5/2006 | Hirota ......................... 348/311 |
| 2006/0164532 | A1 * | 7/2006 | Ikeda .......................... 348/311 |
| 2007/0103573 | A1 * | 5/2007 | Sakamoto et al. ........... 348/294 |
| 2007/0242147 | A1 * | 10/2007 | Kawai ......................... 348/272 |

FOREIGN PATENT DOCUMENTS

JP    2004-55786 A    2/2004

* cited by examiner

*Primary Examiner*—John R Lee
(74) *Attorney, Agent, or Firm*—Birch, Stewart, Kolasch & Birch, LLP

(57) ABSTRACT

A driving method for a solid-state imaging device including a plurality of photoelectric conversion elements, VCCDs, a line memory, and an HCCD includes: transferring all of the electric charges, which are stored in the line memory in an array, to the HCCD; and transferring only an electric charge, which is positioned at an upstream side of the HCCD in the charge transfer direction, of two adjacent electric charges having the same color components among the transferred electric charges in the horizontal direction and adding the two electric charges. In the solid-state imaging device, a characteristic of each of the plurality of photoelectric conversion elements is determined such that in the case of focusing on a certain electric charge, the array of the electric charges transferred from the vertical charge transfer parts and stored in the line memory is an array in which one of the two electric charges adjacent to the focused electric charge has the same color component as the focused electric charge and the other electric charge has a different color component from the focused electric charge.

7 Claims, 6 Drawing Sheets

DRIVING METHOD FOR SOLID-STATE IMAGING DEVICE AND IMAGING APPARATUS

BACKGROUND OF THE INVENTION

1. Field of the Invention

The present invention relates to a driving method for a solid-state imaging device configured to include: a plurality of photoelectric conversion elements formed on a semiconductor substrate; a plurality of vertical charge transfer parts that transfer electric charges generated in the plurality of photoelectric conversion elements in the vertical direction; a line memory that temporarily stores the electric charges transferred from the plurality of vertical charge transfer parts; and a horizontal charge transfer part that transfers the electric charges stored in the line memory in the horizontal direction perpendicular to the vertical direction.

2. Description of the Related Art

The related-art solid-state imaging device in which low-sensitivity photoelectric conversion elements, which are arrayed in a square lattice and have low detection sensitivity, and high-sensitivity photoelectric conversion elements, which are arrayed in a square lattice and have high detection sensitivity, are alternately disposed on a silicon substrate so as to be adjacent to each other and shifted from each other such that a honeycomb-like array pattern is formed is proposed in JP-A-2004-055786, for example.

The detection sensitivity of a photoelectric conversion element refers to a property indicating how many signals can be taken out from the photoelectric conversion element when a predetermined amount of light is incident on the photoelectric conversion element. That is, it can be defined that a high-sensitivity photoelectric conversion element having relatively high sensitivity has a property that a larger amount of signals can be taken out when the same amount of light is incident than a low-sensitivity photoelectric conversion element having relatively low sensitivity. In the case of the high-sensitivity photoelectric conversion element, a large amount of signals can be obtained with a small amount of light. Accordingly, the high-sensitivity photoelectric conversion element is most appropriate for photographing a photographic subject under low luminance. However, a signal is immediately saturated when a large amount of light is incident on the high-sensitivity photoelectric conversion element, and accordingly, the high-sensitivity photoelectric conversion element is not suitable for photographing the photographic subject under high luminance. On the other hand, in the case of the low-sensitivity photoelectric conversion element, a large amount of signals cannot be obtained even if a large amount of light is incident. Accordingly, the low-sensitivity photoelectric conversion element is most appropriate for photographing a photographic subject under high luminance. However, the amount of signals obtainable is too small when a small amount of light is incident, and accordingly, the low-sensitivity photoelectric conversion element is not suitable for photographing the photographic subject under low luminance.

In a solid-state imaging device disclosed in JP-A-2004-055786, a dynamic range can be extended by mixing a low-sensitivity signal obtained from a low-sensitivity photoelectric conversion element and a high-sensitivity signal obtained from a high-sensitivity photoelectric conversion element.

As methods of mixing signals, a method in which a low-sensitivity signal and a high-sensitivity signal are separately read and are then mixed in a subsequent-stage signal processing unit and a method of adding a low-sensitivity electric charge generated in a low-sensitivity photoelectric conversion element and a high-sensitivity electric charge generated in a high-sensitivity photoelectric conversion element at the time of transfer are considered. A method of adding a low-sensitivity electric charge and a high-sensitivity electric charge corresponding to the same color components and transferring the added electric charges in a solid-state imaging device having the configuration disclosed in JP-A-2004-055786 will be described with reference to FIG. 6.

FIG. 6 is a view explaining the related-art driving method in a case of performing addition of electric charges in a solid-state imaging device having the configuration disclosed in JP-A-2004-055786.

Referring to FIG. 6, a solid-state imaging device includes a plurality of VCCDs, an HCCD, and a line memory provided between the plurality of VCCDs and the HCCD. In addition, the line memory is driven by a driving pulse LM having a high level (hereinafter, simply referred to as 'H') or a low level (hereinafter, simply referred to as 'L'), and the HCCD is driven in a four phase by driving pulses φH1 to φH4 each having an 'H' or an 'L'. Moreover, an electrode to which the driving pulse φH1 is supplied, an electrode to which the driving pulse φH2 is supplied, an electrode to which the driving pulse φH3 is supplied, and an electrode to which the driving pulse φH4 is supplied among electrodes included in the HCCD are expressed as H1, H2, H3, and H4, respectively. In addition, among electric charges obtained from high-sensitivity photoelectric conversion elements, an electric charge corresponding to a red component is expressed as 'R' and an electric charge corresponding to a green component is expressed as 'G'. In addition, among electric charges obtained from low-sensitivity photoelectric conversion elements, an electric charge corresponding to a red component is expressed as 'r' and an electric charge corresponding to a green component is expressed as 'g'.

Electric charges transferred from the plurality of VCCDs are stored in the line memory, and then the driving pulses φH1 and φH3 are changed to 'l' at time t1 and the driving pulse φLM is changed to 'L' at time t2 such that the low-sensitivity electric charges 'r' and 'g' are transferred to transfer channels below the electrodes H1 and H3. Then, the driving pulse φLM is changed to 'H' at time t3 and then the driving pulses φH1 and φH3 are changed to 'L' and the driving pulses φH2 and φH4 are changed to 'H' at time t4, such that the electric charge 'g' positioned below the electrode H1 is transferred below the electrode H4 and the electric charge 'r' positioned below the electrode H3 is transferred below the electrode H2. Then, the driving pulse φLM is changed to 'L' at time t5, such that the high-sensitivity electric charges 'R' and 'G' are transferred to transfer channels below the electrodes H2 and H4. As a result, the electric charge 'R' is added to the electric charge 'r', and the electric charge 'G' is added to the electric charge 'g'. After addition of the electric charges, the added electric charges are sequentially transferred by changing the driving pulse φLM to 'H' at time t5 and then switching the driving pulses φH1 to φH4 between 'L' and 'H'.

In the driving method shown in FIG. 6, it is necessary to perform transfer of electric charges from a line memory to an HCCD twice in order to add the electric charges. Accordingly, in the case when the number of pixels increases, a frame rate decreases in the driving method described above.

SUMMARY OF THE INVENTION

The invention has been finalized in view of the above situation, and it is an object of the invention to provide a driving method for a solid-state imaging device capable of realizing a high frame rate.

According to an aspect of the invention, there is provided a driving method for a solid-state imaging device, the solid-state imaging device comprising: a plurality of photoelectric conversion elements formed on a semiconductor substrate; a plurality of vertical charge transfer parts that transfer electric charges generated in said plurality of photoelectric conversion elements in the vertical direction; a line memory that temporarily stores the electric charges transferred from said plurality of vertical charge transfer parts; and a horizontal charge transfer part that transfers the electric charges stored in the line memory in the horizontal direction perpendicular to the vertical direction, the driving method comprising: an electric charge transferring step of transferring all of the electric charges, which are stored in the line memory in an array, to the horizontal charge transfer part; an adding step of transferring only an electric charge, which is positioned at an upstream side of the horizontal charge transfer part in the charge transfer direction, of two adjacent electric charges having the same color components among the electric charges transferred to the horizontal charge transfer part in the horizontal direction and adding the two electric charges; and a horizontal transfer step of transferring the added electric charges in the horizontal direction, wherein in the solid-state imaging device, a characteristic of each of said plurality of photoelectric conversion elements is determined such that in the case of focusing on a certain electric charge, and the array of the electric charges transferred from said plurality of vertical charge transfer parts and stored in the line memory is an array in which one of the two electric charges adjacent to the focused electric charge has the same color component as the focused electric charge and the other electric charge has a different color component from the focused electric charge.

In the driving method for a solid-state imaging device described above, it is preferable to further include a voltage changing step of, after completing transfer of electric charges in the electric charge transferring step, changing a voltage applied to the line memory to a higher voltage than that at the time of the transfer. In addition, preferably, the voltage changing step and the adding step are started at the same time.

Furthermore, in the driving method for a solid-state imaging device described above, it is preferable to further include a voltage changing step of, after completing transfer of electric charges in the electric charge transferring step, changing a voltage applied to the line memory to a higher voltage than that at the time of the transfer of electric charges. In addition, preferably, the voltage changing step is performed after the adding step.

According to another aspect of the invention, an imaging apparatus includes: a driving unit that performs driving based on the driving method for a solid-state imaging device described above; and the solid-state imaging device.

DETAILED DESCRIPTION OF THE INVENTION

Hereinafter, an embodiment of the invention will be described with reference to the accompanying drawings.

Figure 1:
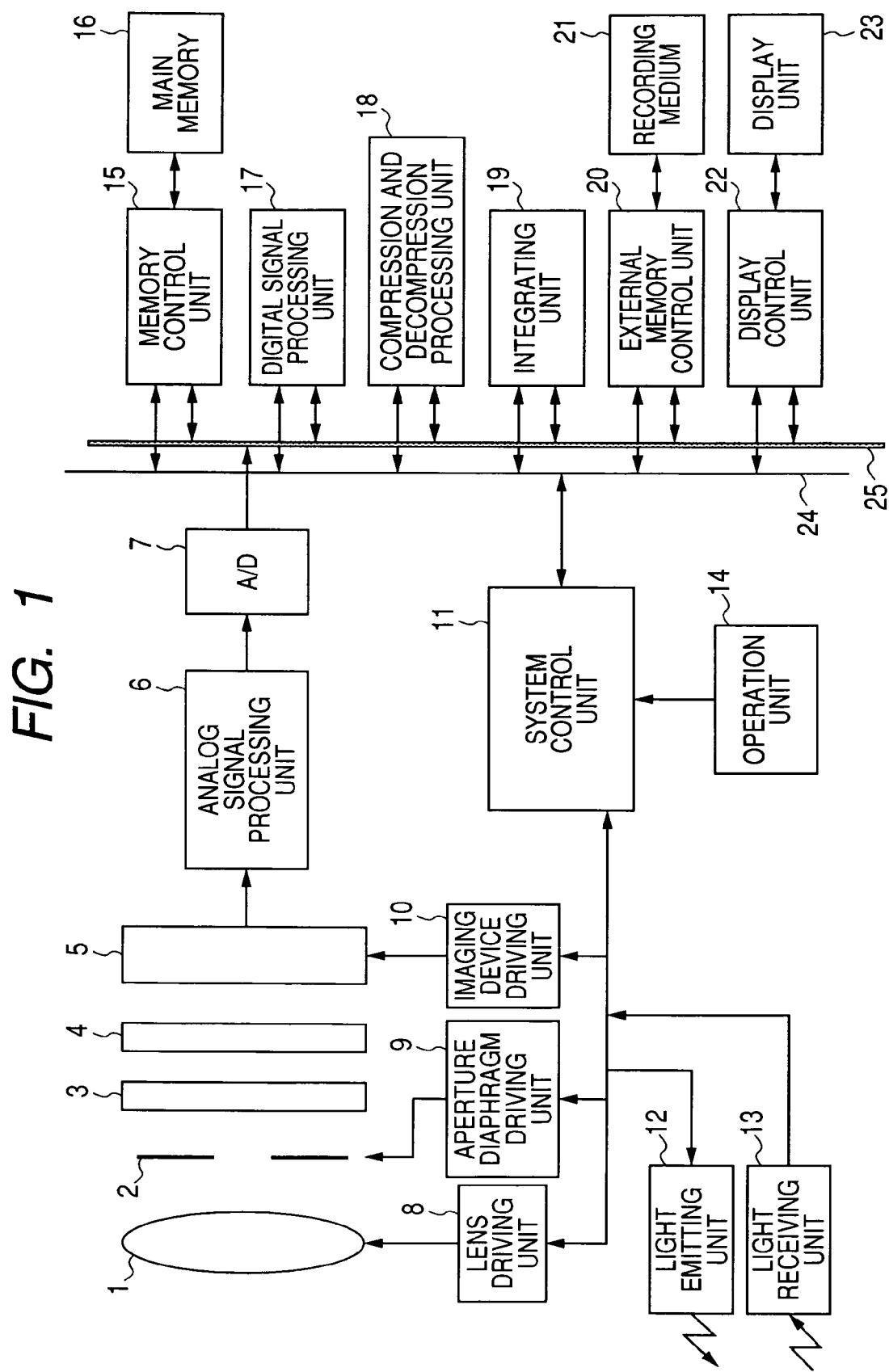
FIG. 1 is a view schematically illustrating the configuration of a digital camera that is an example of an imaging apparatus for describing an embodiment of the invention.

FIG. 1 is a view schematically illustrating the configuration of a digital camera that is an example of an imaging apparatus for describing an embodiment of the invention.

An imaging system of the digital camera shown in FIG. 1 includes an imaging lens 1, a CCD type solid-state imaging device 5, an aperture diaphragm 2 provided between the imaging lens 1 and the solid-state imaging device 5, an infrared cut filter 3 and an optical low pass filter 4.

A system control unit 11 that makes an overall control of the entire electric control system of the digital camera controls a flash light emitting unit 12 and a light receiving unit 13, controls a lens driving unit 8 to adjust the position of the imaging lens 1 to a focusing position or to perform a zoom adjustment, or controls the aperture of the aperture diaphragm 2 through an aperture diaphragm driving unit 9 so as to adjust the amount of exposed light.

Moreover, the system control unit 11 drives the solid-state imaging device 5 through an imaging device driving unit 10 and outputs a photographic image, which is imaged through the imaging lens 1, as a color signal. An instruction signal from a user is input to the system control unit 11 through an operation unit 14.

Further, the electric control system of the digital camera includes: an analog signal processing unit 6 that is connected to an output of the solid-state imaging device 5 and performs analog signal processing, such as correlation double sampling processing; and an A/D conversion circuit 7 that converts RGB color signals, which are output from the analog signal processing unit 6, into digital signals. The analog signal processing unit 6 and the A/D conversion circuit 7 are controlled by the system control unit 11.

Furthermore, the electric control system of the digital camera includes: a main memory 16; a memory control unit 15 connected to the main memory 16; a digital signal processing unit 17 that performs an interpolating operation or a correction operation, RGB/YC conversion processing, and the like to create image data; a compression and decompression processing unit 18 that compresses image data created by the digital signal processing unit 17 in a JPEG format or decompresses the compressed data; an integrating unit 19 that integrates photometric data and calculates a gain of white balance correction performed by the digital signal processing unit 17; an external memory control unit 20 to which a detachable recording medium 21 is connected; and a display control unit 22 connected with a liquid crystal display unit 23 mounted on a back surface of the camera. These components described above are connected to one another by a control bus 24 and a data bus 25 and are controlled by an instruction from the system control unit 11.

Figure 2:
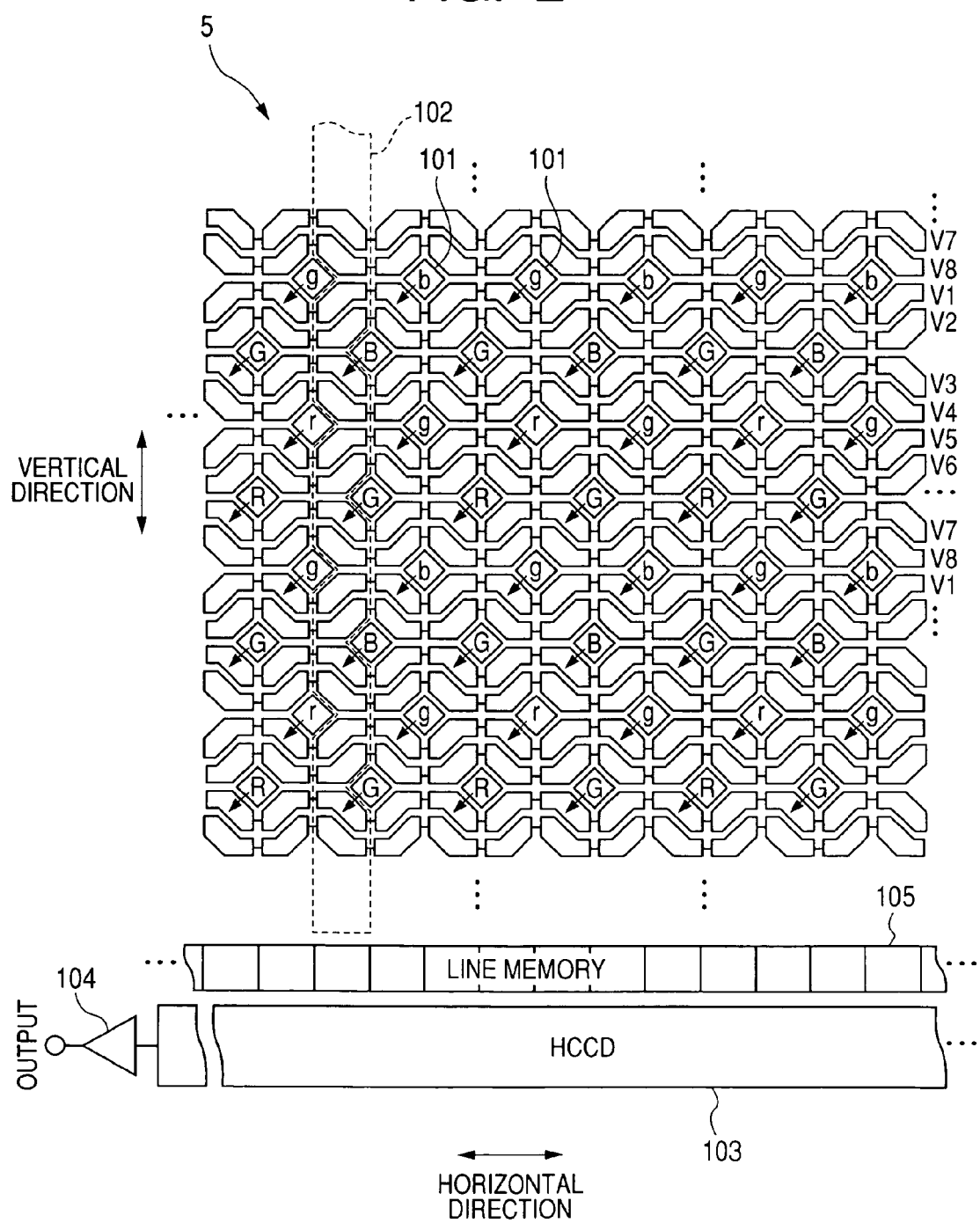
FIG. 2 is a plan view schematically illustrating a solid-state imaging device shown in FIG. 1.

FIG. 2 is a plan view schematically illustrating the solid-state imaging device 5 shown in FIG. 1.

The solid-state imaging device 5 is configured to include: a plurality of photoelectric conversion elements 101 that are arrayed on a semiconductor substrate in a vertical direction and a horizontal direction perpendicular to the vertical direction; a plurality of vertical charge transfer parts (VCCD) 102 that transfer electric charges generated in the plurality of photoelectric conversion elements 101 in the vertical direction; a line memory 105 that temporarily stores the electric charges transferred from the plurality of vertical charge transfer parts 102; a horizontal charge transfer part (HCCD) 103 that transfers the electric charges output from the line memory 105 in the horizontal direction; and an output unit 104 that outputs signals corresponding to electric charges transferred from the horizontal charge transfer part 103.

The plurality of photoelectric conversion elements 101 has a configuration in which 'm' ('m' is a natural number equal to or larger than 2) photoelectric conversion element rows each of which includes 'n' ('n' is a natural number equal to or larger than 2) photoelectric conversion elements 101 arrayed in the horizontal direction are arrayed in the vertical direction or a configuration in which 'n' photoelectric conversion element rows each of which includes 'm' photoelectric conversion elements 101 arrayed in the vertical direction are arrayed in the horizontal direction. Odd-numbered photoelectric conversion element rows are arrayed to be horizontally shifted with respect to even-numbered photoelectric conversion element rows by about ½ of a photoelectric conversion element array pitch of each of the photoelectric conversion element rows. That is, the plurality of photoelectric conversion elements 101 are arrayed in a so-called honeycomb array.

The photoelectric conversion elements 101 included in the odd-numbered photoelectric conversion element rows are low-sensitivity photoelectric conversion elements whose detection sensitivities are relatively low. The odd-numbered photoelectric conversion element rows include: a row in which the low-sensitivity photoelectric conversion element 101 (hereinafter, referred to as 'g photoelectric conversion element 101'; described in a reference numeral 'g' in FIG. 2) that detects light within a wavelength range of a green color and the low-sensitivity photoelectric conversion element 101 (hereinafter, referred to as 'b photoelectric conversion element 101'; described in a reference numeral 'b' in FIG. 2) that detects light within a wavelength range of a blue color are alternately arrayed in the horizontal direction under a state where the g photoelectric conversion element 101 is placed at the head; and a row in which the low-sensitivity photoelectric conversion element 101 (hereinafter, referred to as 'r photoelectric conversion element 101'; described in a reference numeral 'r' in FIG. 2) that detects light within a wavelength range of a red color and the g photoelectric conversion element 101 are alternately arrayed in the horizontal direction under a state where the r photoelectric conversion element 101 is placed at the head. In addition, these two rows are alternately arrayed in the vertical direction.

The photoelectric conversion elements 101 included in the even-numbered photoelectric conversion element rows are high-sensitivity photoelectric conversion elements whose detection sensitivities are relatively high. The even-numbered photoelectric conversion element rows include: a row in which the high-sensitivity photoelectric conversion element 101 (hereinafter, referred to as 'G' photoelectric conversion element 101'; described in a reference numeral 'G' in FIG. 2) that detects light within a wavelength range of a green color and the high-sensitivity photoelectric conversion element 101 (hereinafter, referred to as 'B photoelectric conversion element 101'; described in a reference numeral 'B' in FIG. 2) that detects light within a wavelength range of a blue color are alternately arrayed in the horizontal direction under a state where the G photoelectric conversion element 101 is placed at the head; and a row in which the high-sensitivity photoelectric conversion element 101 (hereinafter, referred to as 'R photoelectric conversion element 101'; described in a reference numeral 'R' in FIG. 2) that detects light within a wavelength range of a red color and the G photoelectric conversion element 101 are alternately arrayed in the horizontal direction under a state where the R photoelectric conversion element 101 is placed at the head. In addition, these two rows are alternately arrayed in the vertical direction.

In order to change the detection sensitivity of photoelectric conversion elements, the area of a light receiving surface of each photoelectric conversion element may be changed, or the collecting area may be changed using a microlens provided above the photoelectric conversion element. Alternatively, the exposure time may be changed using the low-sensitivity photoelectric conversion elements 101 and the high-sensitivity photoelectric conversion elements 101. Alternatively, a gain of electric charges obtained from the low-sensitivity photoelectric conversion elements 101 and electric charges obtained from the high-sensitivity photoelectric conversion elements 101 may be changed in the output unit 104.

One VCCD 102 is provided corresponding to each of the photoelectric conversion element rows. To each VCCD 102, electric charges from the 'm' photoelectric conversion elements 101 included in the photoelectric conversion element row corresponding to the VCCD 102 are read.

Between each photoelectric conversion element row and a charge transfer channel of the VCCD 102 corresponding thereto, a charge read region that is schematically shown by arrow in the drawing is formed. Through the charge read region, electric charges generated in the photoelectric conversion elements 101 during exposure time are read to a charge transfer channel of the VCCD 102.

On a surface of the semiconductor substrate in the horizontal direction thereof, vertical transfer electrodes V1, V2, . . . , and V8 are provided so as not to be on the same line as each of the photoelectric conversion elements 101. On the semiconductor surface, a charge transfer channel (not shown) is formed on a side portion of each photoelectric conversion element row so as not to be on the same line as the photoelectric conversion elements 101. The charge transfer channel and the vertical transfer electrodes V1 to V8 vertically provided on the charge transfer channel form the VCCD 102. The VCCD 102 is transfer-driven by a vertical transfer pulse φV output from the imaging device driving unit 10. A vertical transfer electrode of the VCCD 102 nearest to the line memory 105 is V8. Vertical transfer pulses φV1, φV2, . . . , and φV8 are supplied to the vertical transfer electrodes V1, V2, . . . , and V8, respectively.

The line memory 105 is configured to include 'n' charge storage regions corresponding to the VCCDs 102 and driving electrodes provided above the charge storage regions. In each of the charge storage regions, electric charges transferred from the corresponding VCCD 102 are temporarily stored. A driving pulse φLM output from the imaging device driving unit 10 is supplied to the driving electrodes of the line memory 105, and the line memory 105 is driven by the driving pulse φLM.

The HCCD 103 is configured to include a charge transfer channel (not shown) and electrodes provided thereon. The HCCD 103 is driven in a four phase by horizontal transfer pulses φH1, φH2, φH3, and φH4 output from the imaging device driving unit 10. The HCCD 103 is configured to include 'n' charge transfer stages corresponding to respective charge storage regions of the line memory. Electric charges stored in a charge storage region corresponding to each of the charge transfer stages are transferred to the charge transfer stage.

Each charge transfer stage is configured to include a pair electrodes, to which the same driving pulse is supplied, and a charge transfer channel provided below the pair of electrodes. The pair of electrodes that forms each charge transfer stage includes an electrode H1 to which the horizontal transfer pulse φH1 is supplied, an electrode H2 to which the horizontal transfer pulse φH2 is supplied, an electrode H3 to which the horizontal transfer pulse φH3 is supplied, and an electrode H4 to which the horizontal transfer pulse φH4 is supplied. For example, an array of the electrodes H1 to H4 is obtained by repeatedly arranging a pattern, in which the electrodes H1 to H4 are horizontally arrayed in this order, in the horizontal direction.

In addition, although terms of 'vertical' and 'horizontal' have been used in the above description, the terms of 'vertical' and 'horizontal' refer to 'one direction' and 'direction approximately perpendicular to the one direction' on a surface of a semiconductor substrate.

In the solid-state imaging device 5 configured as described above, electric charges obtained from two adjacent photoelectric conversion element rows can be stored at a time. Assuming that an electric charge obtained from the R photoelectric conversion element 101 is 'R', an electric charge obtained from the G photoelectric conversion element 101 is 'G', an electric charge obtained from the B photoelectric conversion element 101 is 'B', an electric charge obtained from the r photoelectric conversion element 101 is 'r', an electric charge obtained from the g photoelectric conversion element 101 is 'g', and an electric charge obtained from the b photoelectric conversion element 101 is 'b', the array of the electric charges under a state where the electric charges are stored in the respective charge storage regions of the line memory 105 is like 'RrGgRrGgRrGg . . .' or 'GgBbGgBbGgBb . . .'. That is, in the case of focusing on a predetermined electric charge, the electric charges stored in the respective charge storage regions of the line memory 105 are arrayed such that one of two electric charges adjacent to the focused electric charge has the same color component as the focused electric charge and the other electric charge has a different color component from the focused electric charge.

Next, a driving method for adding and reading electric charges will be described.

Figure 3:
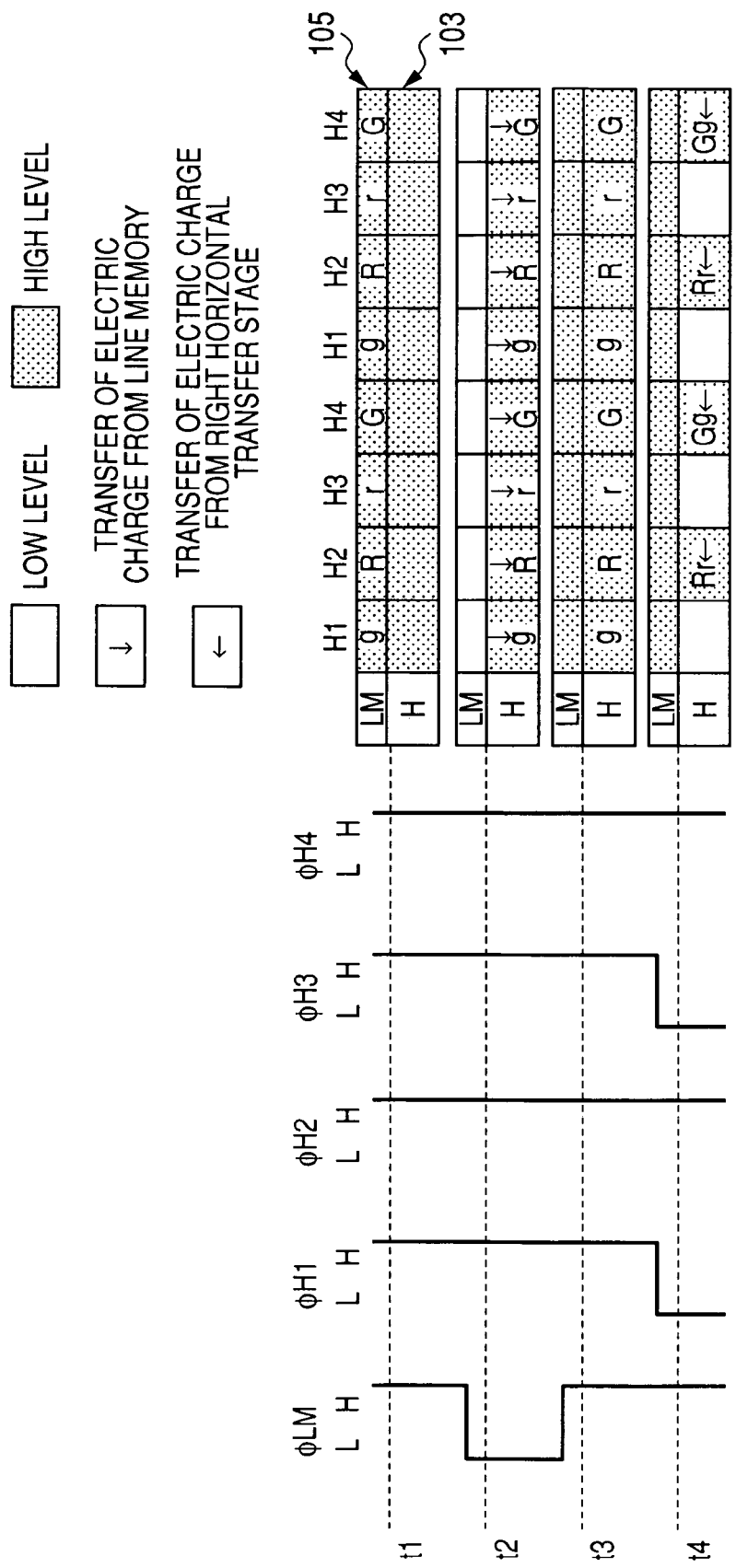
FIG. 3 is a view explaining a driving method for the solid-state imaging device 5 shown in FIG. 2.

FIG. 3 is a view explaining a driving method for the solid-state imaging device 5 shown in FIG. 2.

In FIG. 3, each charge storage region of the line memory 105 is shown in the shape of a rectangular block. In addition, a charge transfer stage of the HCCD 105 corresponding to each charge storage region is shown below each charge storage region in the shape of a rectangular block. In addition, the electrodes H1 to H4 that form the respective charge transfer stages are shown above the charge transfer stages.

After exposure time ends, electric charges are read from the photoelectric conversion elements 101 to the VCCD 102, and the VCCD 102 is driven such that the electric charges are transferred in the vertical direction. Then, the electric charges ( . . . gRrGgRrG . . . ) obtained from two adjacent photoelectric conversion element rows are stored in the line memory 105 to which the driving pulse φLM having an 'H' level is supplied (time t1). At this time, the horizontal transfer pulses φH1 to φH4 supplied to the electrodes H1 to H4 have H levels.

Then, the driving pulse φLM is changed to an 'L' level, such that the electric charges stored in each charge storage region are transferred to the charge transfer stage corresponding to each charge storage region (time t2). Then, the driving pulse φLM is changed again to an 'H' level so that the electric charges from the VCCD 102 can be stored in the line memory 105 (time t3). Then, in order to cause only an electric charge, which is positioned at an upstream side of the HCCD 103 in the charge transfer direction, of two adjacent electric charges having the same color components among the electric charges transferred to the HCCD 103 to be transferred in the horizontal direction, the horizontal transfer pulses φH1 and φH3 are changed to an 'L' level, such that the electric charge 'g' existing below the electrode H1 is transferred below the electrode H4 and the electric charge 'r' existing below the electrode H3 is transferred below the electrode H2 (time t4). By driving at time t4, the electric charge 'r' is added to the electric charge 'R' and the electric charge 'g' is added to the electric charge 'G'. After addition of the electric charges, the added electric charges are sequentially transferred in the horizontal direction by switching the horizontal transfer pulses φH1 to φH4 between 'L' and 'H' levels.

After transferring the added electric charges in the horizontal direction or while transferring the added electric charges in the horizontal direction, the VCCD 102 is driven such that electric charges ( . . . bGgBbGgB . . . ) obtained from two adjacent photoelectric conversion element rows are stored in the line memory 105. Then, by supplying the driving pulse φLM and the horizontal transfer pulses φH1 to φH4 in the same manner as time t2 to t4, the electric charge 'g' is added to the electric charge 'G' and the electric charge 'b' is added to the electric charge 'B'. After addition of the electric charges, the added electric charges are sequentially transferred in the horizontal direction by switching the horizontal transfer pulses φH1 to φH4 between 'L' and 'H' levels.

By repeating such driving, a signal is read out from all of the photoelectric conversion elements 101.

According to the driving method described above, the electric charges obtained from the high-sensitivity photoelectric conversion elements 101 and the electric charges obtained from the low-sensitivity photoelectric conversion elements 101, which are adjacent to the high-sensitivity photoelectric conversion elements 101 and detect the same color components, can be added while the electric charges are being transferred from the line memory 105 to the HCCD 103 once. Accordingly, it becomes possible to read a signal in a higher speed than in the related art. As a result, even in the case when the number of pixels increases, it is possible to prevent a decrease in frame rate.

Figure 4:
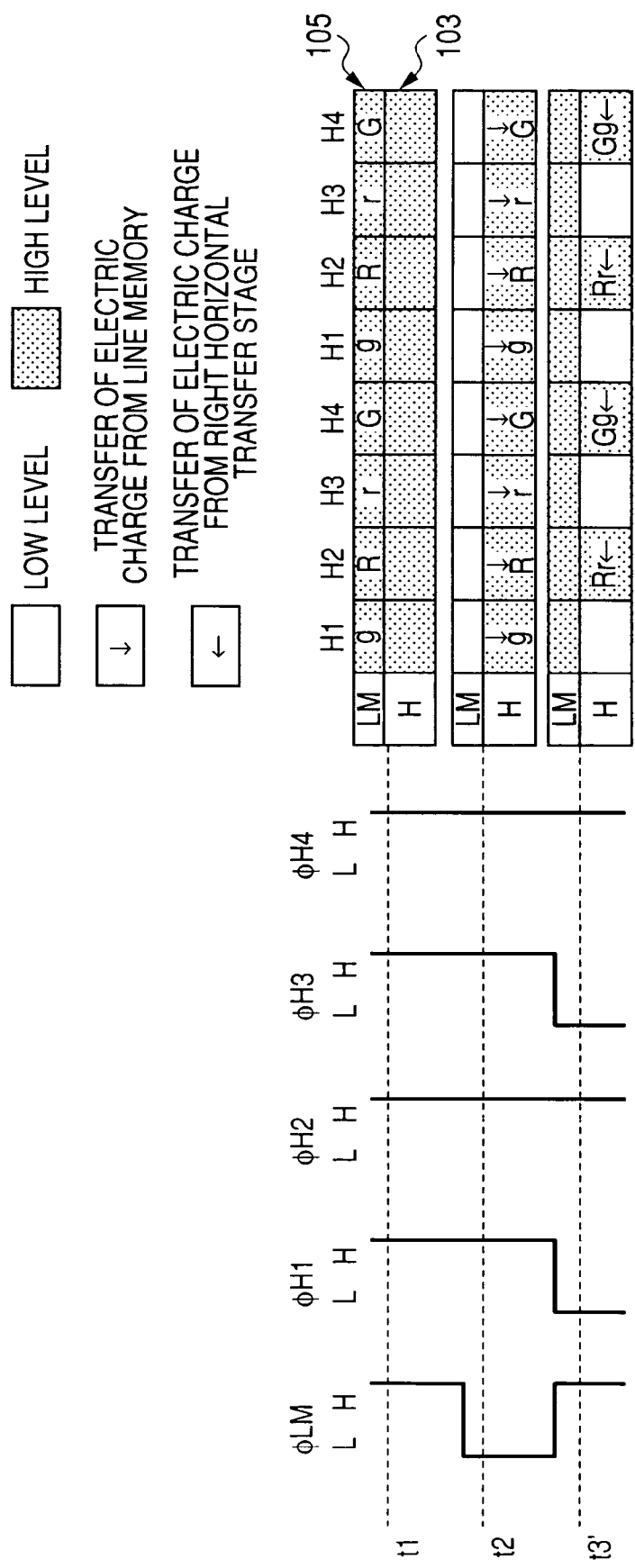
FIG. 4 is a view explaining a driving method (modification) for the solid-state imaging device 5 shown in FIG. 2.

Further, in the driving method shown in FIG. 3, after time t2, the driving pulse φLM is changed to an 'H' level at time t3 and then the addition of electric charges is executed at time t4. However, as shown in FIG. 4, it may be possible to change the driving pulse φLM to an 'H' level and change the horizontal transfer pulses φH1 and φH3 to an 'L' level at the same time at time t3' after transferring electric charges of the line memory 105 to the HCCD 103 at time t2. In this manner, it is possible to make a driving time shorter than the method shown in FIG. 3. In addition, it is possible to make a period of time, for which the horizontal transfer pulses φH1 and φH3 are in an 'H' level, shorter than the method shown in FIG. 3. As a result, power consumption can be suppressed.

Figure 5:
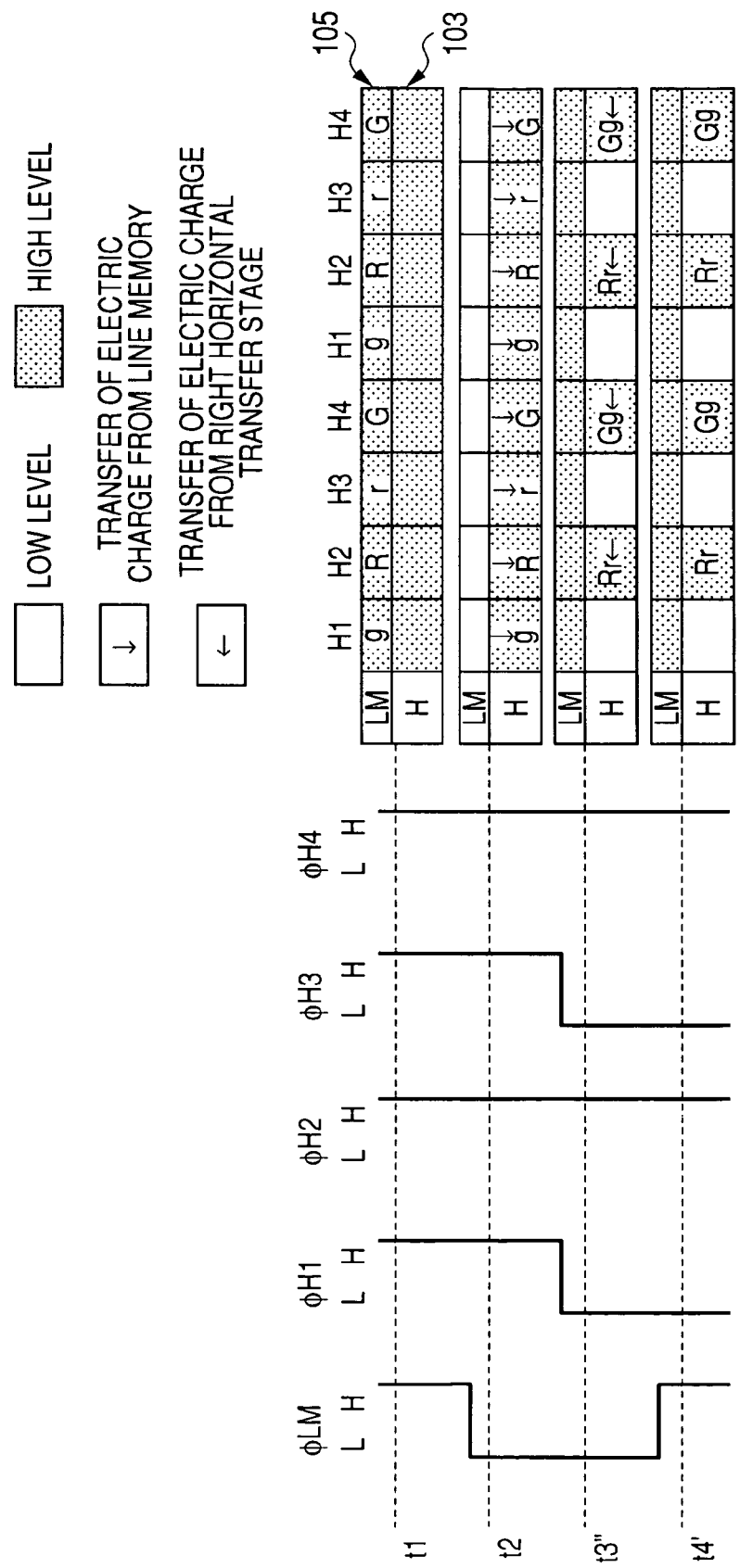
FIG. 5 is a view explaining a driving method (modification) for the solid-state imaging device 5 shown in FIG. 2.
Figure 6:
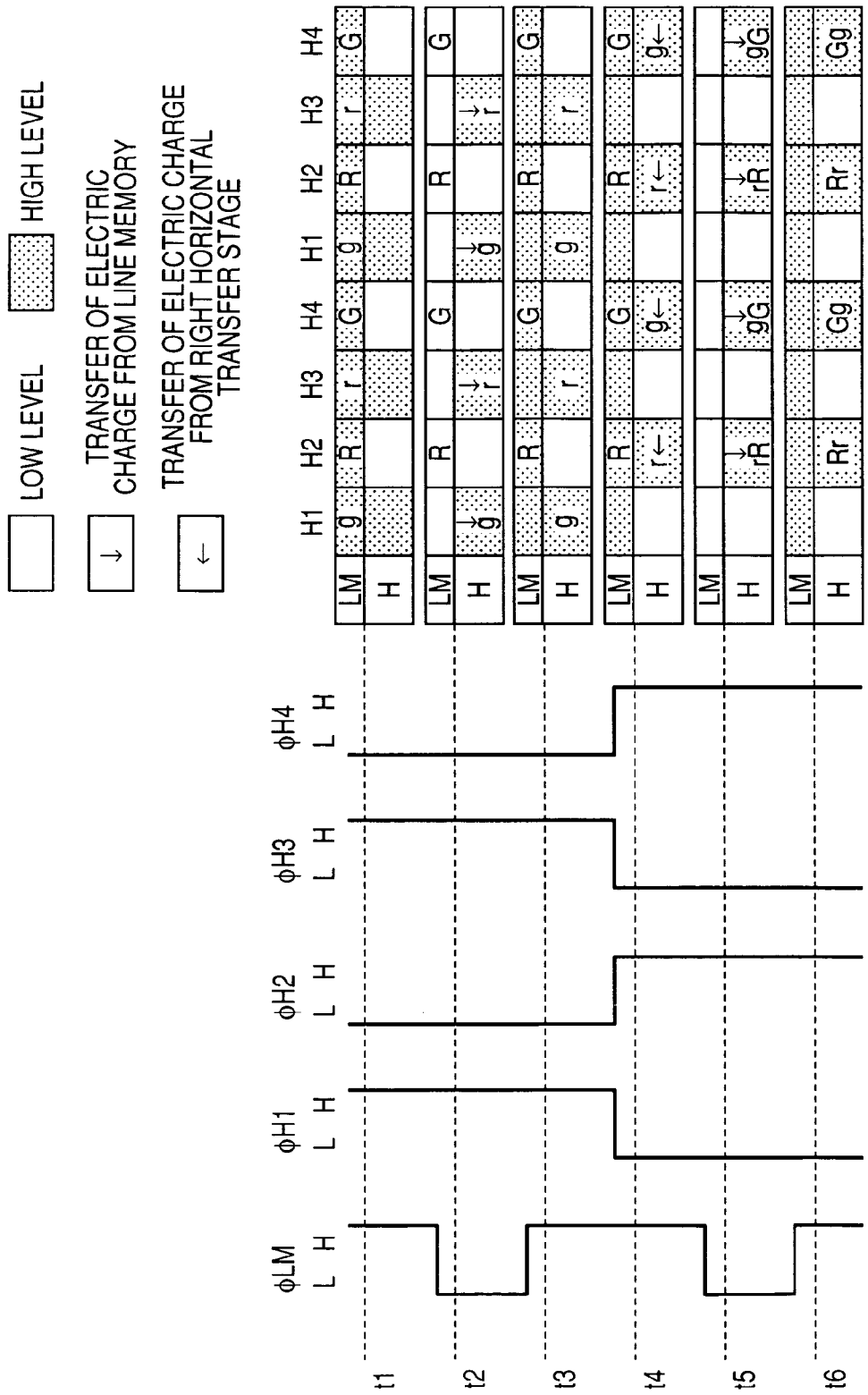
FIG. 6 is a view explaining the related-art driving method in a case of performing addition of electric charges in a solid-state imaging device having the configuration disclosed in JP-A-2004-055786.

Alternatively, as shown in FIG. 5, it may be possible to transfer electric charges of the line memory 105 to the HCCD 103 at time t2, to change the horizontal transfer pulses φH1 and φH3 to an 'L' level and execute addition of the electric charges at time t3", and then to change the driving pulse φLM to an 'H' level at time t4'. In this way, it is possible to make a period of time, for which the horizontal transfer pulses φH1 and φH3 are in an 'H' level, shorter than the method shown in FIG. 3. As a result, the power consumption can be suppressed.

Furthermore, the driving method described in the present embodiment may be applied as long as characteristics and array of the photoelectric conversion elements 101 are determined such that the array of electric charges under a state where the electric charges are stored in respective charge storage regions of the line memory 105 is as follows. That is, in the case of focusing on a predetermined electric charge, if the electric charges stored in the respective charge storage regions of the line memory 105 are arrayed such that one of two electric charges adjacent to the focused electric charge has the same color component as the focused electric charge and the other electric charge has a different color component from the focused electric charge, the driving method described in the present embodiment may be applied.

According to the invention, it is possible to provide a driving method for a solid-state imaging device capable of realizing a high frame rate.

The entire disclosure of each and every foreign patent application from which the benefit of foreign priority has been claimed in the present application is incorporated herein by reference, as if fully set forth.

What is claimed is:

1. A driving method for a solid-state imaging device, the solid-state imaging device comprising:
   a plurality of photoelectric conversion elements formed on a semiconductor substrate;
   a plurality of vertical charge transfer parts that transfer electric charges generated in said plurality of photoelectric conversion elements in the vertical direction;
   a line memory that temporarily stores the electric charges transferred from said plurality of vertical charge transfer parts; and
   a horizontal charge transfer part that transfers the electric charges stored in the line memory in the horizontal direction perpendicular to the vertical direction,
   the driving method comprising:
      an electric charge transferring step of transferring all of the electric charges, which are stored in the line memory in an array, to the horizontal charge transfer part;
      an adding step of transferring only an electric charge, which is positioned at an upstream side of the horizontal charge transfer part in the charge transfer direction, of two adjacent electric charges having the same color components among the electric charges transferred to the horizontal charge transfer part in the horizontal direction and adding the two electric charges; and
      a horizontal transfer step of transferring the added electric charges in the horizontal direction,
      wherein the solid-state imaging device has a characteristic of each of said plurality of photoelectric conversion elements such that for a selected electric charge, the array of the electric charges transferred from said plurality of vertical charge transfer parts and stored in the line memory is an array in which one of the two electric charges adjacent to the selected electric charge has the same color component as the selected electric charge and the other electric charge of the two adjacent electric charges has a different color component from the selected electric charge.

2. The driving method for a solid-state imaging device according to claim 1, further comprising:
   a voltage changing step of, after completing transfer of electric charges in the electric charge transferring step, changing a voltage applied to the line memory to a higher voltage than that at the time of the transfer of electric charges,
   wherein the voltage changing step and the adding step are started at the same time.

3. The driving method for a solid-state imaging device according to claim 1, further comprising:
   a voltage changing step of, after completing transfer of electric charges in the electric charge transferring step, changing a voltage applied to the line memory to a higher voltage than that at the time of the transfer of electric charges,
   wherein the voltage changing step is performed after the adding step.

4. The driving method for a solid-state imaging device according to claim 1,
   wherein said plurality of photoelectric conversion elements comprises: first photoelectric conversion elements on a first line at a common pitch; and second photoelectric conversion elements on a second line at the common pitch, the second line being adjacent to and substantially parallel to the first line,
   wherein the first photoelectric conversion elements and the second photoelectric conversion elements are shifted to each other along a direction of the first line by substantially a half pitch.

5. An imaging apparatus comprising:
   a driving unit that performs driving based on the driving method for a solid-state imaging device according to claim 1; and
   the solid-state imaging device.

6. A driving method for a solid-state imaging device, the solid-state imaging device comprising:
   a plurality of photoelectric conversion elements formed on a semiconductor substrate;
   a plurality of vertical charge transfer parts that transfer electric charges generated in said plurality of photoelectric conversion elements in the vertical direction;
   a line memory that temporarily stores the electric charges transferred from said plurality of vertical charge transfer parts; and
   a horizontal charge transfer part that transfers the electric charges stored in the line memory in the horizontal direction perpendicular to the vertical direction,
   the driving method comprising:
      an electric charge transferring step of simultaneously transferring all of the electric charges, which are stored in line memory positions directly adjacent to the horizontal transfer part in an array, to the horizontal charge transfer part;
      an adding step of transferring an electric charge, which is positioned at an upstream side of the horizontal charge transfer part in the charge transfer direction to the downstream direction only if the upstream charge of two adjacent electric charges have the same color components among the electric charges transferred to the horizontal charge transfer part in the horizontal direction and adding the two electric charges; and
      a horizontal transfer step of transferring the added electric charges in the horizontal direction.

7. The driving method for a solid-state imaging device according to claim 6,
wherein said plurality of photoelectric conversion elements comprises: first photoelectric conversion elements on a first line at a common pitch; and second photoelectric conversion elements on a second line at the common pitch, the second line being adjacent to and substantially parallel to the first line,
wherein the first photoelectric conversion elements and the second photoelectric conversion elements are shifted to each other along a direction of the first line by substantially a half pitch.

* * * * *